(12) United States Patent
Maki

(10) Patent No.: US 6,370,667 B1
(45) Date of Patent: Apr. 9, 2002

(54) CRC OPERATING CALCULATING METHOD AND CRC OPERATIONAL CALCULATION CIRCUIT

(75) Inventor: Takashi Maki, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/342,153

(22) Filed: Jun. 15, 1999

(30) Foreign Application Priority Data

Jun. 15, 1998 (JP) .......................................... 10-167595

(51) Int. Cl.$^7$ ............................................. H03M 13/00
(52) U.S. Cl. ...................................... 714/758; 714/781
(58) Field of Search ................................. 714/758, 781

(56) References Cited

U.S. PATENT DOCUMENTS

| 4,782,490 | A | * | 11/1988 | Tenengolts | .................. | 714/756 |
| 5,195,093 | A | * | 3/1993 | Tarrab et al. | ................ | 714/703 |
| 5,390,196 | A | * | 2/1995 | Cecil et al. | .................. | 714/781 |
| 5,642,366 | A | * | 6/1997 | Lee et al. | .................... | 714/762 |
| 5,724,368 | A | * | 3/1998 | Zook | .......................... | 381/71.1 |
| 5,970,148 | A | * | 10/1999 | Meier | ......................... | 713/168 |
| 6,029,186 | A | * | 2/2000 | DesJardins et al. | ......... | 708/492 |
| 6,041,434 | A | * | 3/2000 | Kamishima | .................. | 714/807 |
| 6,049,903 | A | * | 4/2000 | Nishimura | .................. | 714/752 |
| 6,101,624 | A | * | 8/2000 | Cheng et al. | ............... | 714/736 |
| 6,191,614 | B1 | * | 2/2001 | Schultz et al. | ................. | 326/41 |
| 6,204,687 | B1 | * | 3/2001 | Schultz et al. | ................. | 326/40 |
| 6,205,190 | B1 | * | 3/2001 | Antonio et al. | ............. | 375/346 |

OTHER PUBLICATIONS

Cyclic Redundancy Code Computation for a Variable Length Data; Publication–Data: IBM Technical Disclosure Bulletin, Feb. 1993, US; vol. No: 36; Issue No: 2; p. No: 51–54; Publication–Date: Feb. 1, 1993.*

Method for High Speed CRC Computation; Publication –Data: IBM Technical Disclosure Bulletin, Nov. 1984, US; vol. No: 27; Issue No: 6; p. No: 3572–3576; Publication –Date: Nov. 1, 1984.*

Cyclic Redundancy Check System; Publication–Data: IBM Technical Disclosure Bulletin, Feb. 1977, US; Vol. No: 19; Issue No: 9; p. No. 3550–3554; Publication–Date: Feb. 1, 1977.*

Reverse Rotation Fire Code ECC Correction; Publication –Data: IBM Technical Disclosure Bulletin, Oct. 1987, US; vol. No: 30; Issue No: 5; p. No: 41–44; Publication–Date: Oct. 1, 1987.*

* cited by examiner

Primary Examiner—Albert Decady
Assistant Examiner—Joseph D. Torres
(74) Attorney, Agent, or Firm—Cooper & Dunham LLP

(57) ABSTRACT

The invention relates to a CRC operational calculating method of performing CRC code calculation in order to practice judgment of communication data error, and a CRC operational calculation circuit for performing the operational calculation of the CRC code by use of the hardware. The invention completes the calculation of the cyclic redundancy check with one clock cycle, and performs the calculation with high speed. The CRC calculation circuit is constructed such that the respective bits of a third XNOR output signal are inputted to the input stage of a register as the upper-column four bits including the uppermost-column bit of the CRC code, the respective lower-column three bits including the lowermost-column bit of a second XNOR output signal are inputted to the input stage of the register as the fifth through seventh bits of the CRC code, the respective bits of a fourth XNOR output signal are inputted to the input stage of the register as the eighth through eleventh bits of the CRC code, and the respective bits of a second XOR output signal are inputted to the input stage of the register as the lower-column four bits including the lowermost-column bit of the CRC code.

5 Claims, 6 Drawing Sheets

CRC OPERATING CALCULATING METHOD AND CRC OPERATIONAL CALCULATION CIRCUIT

BACKGROUND OF THE INVENTION

1. Field of the Invention

The present invention relates to a code error detecting apparatus for detecting the occurrence or non-occurrence of a code error by performing the communication or data processing of the digital data. More specifically, the present invention relates to a CRC operational calculating method and a CRC operational calculation circuit for generating a CRC (Cyclic Redundancy Check) to perform error detection and correction for received data in a digital communication system.

2. Discussion of the Background Art

In a CRC calculating method and CRC calculation circuit, LSI is typically utilized. The method and circuit have an operational calculating function for calculating a cyclic redundancy check code for detecting the occurrence or non-occurrence of a code error by performing the communication or data processing of the digital data.

High-speed performance of CRC calculation in connection with error detection has been strictly (strongly) required in accordance with the high-speed performance requirements of data communication.

One such background-art CRC calculation circuit aimed at responding to the requirement of high-speed CRC calculation, for instance, is disclosed in the published specification of Japanese Laid-open Patent Publication No. 6-37,737/1994. Hereinafter, the technology relating to the calculation circuit described in this publication will be referred to as "the first background-art technology".

FIG. 3 is a circuit diagram for explaining the CRC calculation circuit of the first background-art technology.

The first background-art CRC calculation circuit includes: n-stage storing circuits 11 connected to each other through the respective corresponding first through (n−1)-th exclusive logical sum circuits 14 and for storing the result of the CRC calculation by the n-order creating multinomial equation. A recurrence symbol selecting circuit 12 selects one of the recurrence code signals from among the first through n-th storing circuit outputs of the n-th hereby certify that this paper is being deposited this date with the storing circuits 11 in accordance with the first through n-th coefficient input signal of the CRC creating multinomial equation. An n-th exclusive logical sum circuit 14 performs an exclusive logical sum of the input binary signal and the recurrence code signal output both for calculating the CRC, and for inputting the output signal thereof to the first storing circuit 11 of the n-stage storing circuits. The first through (n−1)-th logical sum circuits 15 respectively take the logical sum of the output signal of the n-th exclusive logical sum circuit and the first through (n−1)-th coefficient input signals, and respectively input the output signals thereof to the corresponding first through (n−1)-th exclusive logical sum circuits.

In the CRC calculation circuit of such structure, by enabling the coefficient of the CRC creating multinomial equation to be optionally set, when changing-over of the CRC creating multinomial equation is required, it is not necessary to prepare the CRC calculation circuits corresponding to the number (sort) of the required CRC creating multinomial equations.

Furthermore, it is described in the background-art document that only one CRC calculating circuit is sufficient and therefore the size of the circuit can be made small. In addition, even when the coefficient of the required CRC creating multinomial equation has to be changed, it is sufficient to only change the setting thereof. Therefore, it is possible to easily change the setting of the coefficient.

Another type of background-art CRC calculation circuit, for instance, is described in the published specification of Japanese Laid-open Patent Publication No. 9-69,836/1997. Hereinafter, the technology concerning the type of calculation circuit described in this publication is referred to as "the second background-art technology".

FIG. 4 is a circuit diagram for explaining the CRC calculation circuit of the second background-art technology.

In FIG. 4, the second background-art CRC calculation circuit performs division of the information data input in parallel with the previously determined paralleling rate by use of a predetermined CRC creating multinomial equation. By obtaining the surplus (residue) of the division, the CRC code can be created as the error detecting (cyclic) redundancy code for the information data.

The surplus can be obtained by dividing the number of bits of the information data by the paralleling rate. The information data attached with "O" of the same number as that of the value obtained by subtracting the surplus from the parallel rate is multiplied by the monomial equation including the order number of the value obtained as the result of performing the modulo calculation with the period of the CRC creating multinomial equation in connection with the value obtained by subtracting the number of "O" attached to the information data from the number of bits of the CRC code. Thereafter the division is performed by use of the CRC creating multinomial equation, by use of an operational calculation medium. The CRC code generating circuit includes the operational calculation medium for performing such division and the outputting medium for outputting the surplus obtained by the division performed by the above-mentioned operational calculation medium as the CRC code for the information data.

The above background-art document (second background art) describes that, in such structure of the CRC calculation circuit, even though the bit number of the information data can be indivisible (cannot be divided) by the paralleling rate of the CRC calculation, the CRC code creating circuit can be effectively realized.

The document further describes that the paralleling rate of the information input to the calculation circuit need not be changed and nevertheless it is possible to form the structure the same as that of the background-art CRC creating method with very small time delay, and the CRC code can be created without increasing the scale of the circuit (size, number of parts, etc.) and with the time delay as small as possible compared with the background-art circuit structure in which the number of bits of the information data is a multiple of the paralleling rate.

Another type of CRC calculation circuit, for instance, is described in the published specification of Japanese Laid-open Patent Publication No. 6-224,783/1994. The technology concerning this type of circuit is called hereinafter "the third background-art technology".

FIG. 5 is a circuit diagram for explaining the CRC calculation circuit of the third background-art technology.

In FIG. 5, a CRC calculation circuit performs a cyclic coding process and a cyclic redundant code check (CRC) process both for data of a number predetermined by the m-order creating multinomial equation $G(X)$ (m is an integer satisfying $m \leq n/2$) by use of a computer provided with a n-bit commonly used register. The CRC calculation circuit according to the third background-art technology is composed of CPU 100a, a table ROM 200, a data memory 300 and a bus 400. Table ROM 200 stores a surplus table for storing $2^n$ surplus tables created by surplus data obtained by dividing the respective $2^n$ data by the CRC creating multinomial equation. A reference address creating medium generates a reference address of the surplus table. A surplus table reading-out medium reads out the surplus table corresponding to the reference address. A repetition medium repeats a predetermined number of times the reference address creating medium and the surplus table reading-out medium.

Here, when the surplus table satisfies n/2−m=0 for the respective $2^n$ data $\{D^n\}$ [$\{D^n\}=\{d^0, d^1, d^2, \ldots, d^{n-1}\}$, $d^i$ (i is an integer, on the condition of $0 \leq i \leq n-1$) is 0 or 1, K is an integer on the condition of $0 \leq K \leq 2^n$], one of the data created by the modulo-2 division of dividing the data multinomial equation D(X) of the equation 1 drawn out from the data $\{D^n\}$ by the CRC creating multinomial equation G(X) is composed of $2^n$ surplus data of ½ bit. On the contrary, when the surplus table satisfies n/2 −m>0 for the data $\{D^n\}$, the data $\{d^0, d^1, d^2, \ldots, d^{n/2-m+1}\}$ are respectively added to the surplus data $\{r^0, r^1, r^2, \ldots, r^{m-1}\}$ obtained as the result of the modulo-2 division of dividing the data multinomial equation Da(X) of the equation 2 from the (n/2+m)-th bit by the CRC creating multinomial equation G(X). One of the data thus created is composed of $2^n$ data of one bit $\{d^0, d^1, d^2, \ldots, d^{n/2-m+1}, r^0, r^1, r^2, \ldots, r^{m-1}\}$.

Furthermore, the reference address creating medium creates the first reference address in accordance with the first data which is the n-th bit from the head of the data of the predetermined number. The medium further creates the second reference address by connecting the upper-column N/2 bit data of the first surplus table which are read out at the time of creating the first reference address to the lower-column w/2 bit data of the first data.

In such structure of the CRC calculating circuit, by preparing the surplus table previously storing the $2^n$ upper-column table, the processings of shifting and composing can be made possible per each of the n/2 bits. Therefore, the time consumed for the cyclic coding process and the CRC process can be shortened, and the computer can be effectively utilized for the many other processings such as the control of the communication protocol, etc. Moreover, it is not necessary to prepare a high-speed computer for shortening the processing time. The above-mentioned merits are also described in the same document.

Yet another type of CRC calculation circuit, for instance, is disclosed is the published specification of Japanese Laid-open Patent Publication No. 6-311,049/1994. The technology concerning this type of circuit is called hereinafter "the fourth background-art technology".

FIG. 6 is a circuit diagram for explaining the fourth background-art CRC calculation circuit.

In FIG. 6, the fourth background-art CRC calculating circuit is composed of four D-type flip-flops 20 for inputting in parallel the data to be measured per four bits, and sixteen D-type flip-flops 22 (X0~X15), the respective outputs of which are connected to the CRC code outputs. A first exclusive logical sum circuit 24 calculates the exclusive logical sums (W, X, Y, Z) of the upper four columns (X12~X15) output from the sixteen D-type flip-flops 22 and the outputs of the four D-type flip-flops 20 (D0~D3). A second exclusive logical sum circuit 26 calculates the exclusive logical sums (a, b, c, d) of the subsequent upper four columns (X8~X11) outputs of the sixteen D-type flip-flops 22 and the outputs (W, X, Y, Z) of the first exclusive logical sum circuit 24. A third exclusive logical sum circuit 28 calculates the exclusive logical sums (e, f, g, h) of the outputs of the lower four columns (X1~X4) of the sixteen D-type flip-flops 22 excluding the lowermost column and the outputs (W, X, Y, Z) of the first exclusive logical sum circuit 24.

The fourth background-art CRC calculating circuit is constructed such that the outputs (W, X, Y, Z) of the first exclusive logical sum circuit 24 are respectively connected to the inputs the lower four D-type flip-flops 22 (X0~X3). The outputs (h, g, f, e) of the third exclusive logical sum circuit 28 respectively are input to the D-type flip-flops 22 (X5~X8). The outputs of D-type flip-flops 22 (X5~X7) are connected respectively to flip-flop inputs X9~X11, and the outputs (d, c, b, a) of the second exclusive logical sum circuit are connected respectively to the inputs of flip-flops 22 (X12~X15).

In the fourth background-art CRC calculating circuit, the data input circuit inputs in parallel the data to be calculated per four bits, and the first exclusive logical sum circuit 24 calculates the exclusive logical sums W, X, Y, Z by adding the four bits to the upper four columns X12~X15 of the sixteen D-type flip-flops X0~X15 connected to the CRC code output of the CRC code outputting circuit.

Next, the second exclusive logical sum circuit 26 calculates the exclusive logical sums a, b, c, d by adding the subsequent upper four columns X8~X11 output from the sixteen D-type flip-flops 22 and the outputs W, X, Y, Z of the first exclusive logical sum circuit 24. At the same time, the third exclusive logical sum circuit 28 calculates the exclusive logical sum of the outputs of the lower four columns X1~X4 excluding the lowermost column of the sixteen D-type flip-flops X0~X15 and the outputs W, X, Y, Z of the first exclusive logical sum circuit 24.

The respective data are inputted to the input terminals of the sixteen D-type flip-flops X0~X15. Namely, the outputs W, X, Y, Z of the first exclusive logical sum circuit 24 are respectively connected to X0~X3 in the order from the lower column and to the inputs of X0 to X4. The outputs h, g, f, e of the third exclusive logical sum circuit 28 are connected respectively to X5~X8. The outputs of X5~X7 are connected respectively to the inputs of X9~X11, and the outputs a, b, c, d of circuit 26 are connected respectively to the inputs of X12~X15. The above background-art document describes such structure and function as mentioned above.

The same document further describes that, in such structure of the CRC calculation circuit, the processings for creating the CRC code can be simplified and the speed thereof can be raised, by processing the input data per four bits, and furthermore, even in the case of realizing such circuit with software, the coding and decoding of the CRC can be processed with high speed by use of the programming technology.

In the CRC calculation circuits of the first and second background-art technologies, it is easy, in principle, to change the position of the exclusive logical sum gate (XOR gate) situated between the shift registers. Although some merit can be found from the viewpoint of industrial utilization, when a shift register is employed, a data transmission process of only one bit per clock is performed. Consequently, it is necessary to perform the clock shift at least eight times in order to calculate the CRC16·0 for the usually used octet data (eight bits), and therefore such CRC calculation circuit is not in conformity with (not fit for)

high-speed performance. Those matters as mentioned heretofore are the problems to be solved.

Furthermore, regarding the CRC calculation circuit of the third background-art CRC calculation circuit, the calculation result of the cyclic redundancy check is previously stored in the surplus table storing medium (more specifically, system memory ROM) and the necessary value of the CRC calculation can be obtained in such circuit structure by referring to the table. The apparatus (circuit) as mentioned above is well known. However, in such apparatus, the capacity of the system memory is limited. In addition, the apparatus is not optimized for industrial utilization in consideration of the system cycle required for the number subtracting calculation for referring to the memory. These matters as mentioned above are also problems to be solved.

Furthermore, regarding the CRC calculation circuit of the fourth background-art CRC calculation circuit, although the processing for four bits with one clock can be performed and thereby the processing time can be shortened, at least two clocks need to be used in order to obtain the desired CRC calculation value, and thereby it is necessary to previously divide the octet data (eight bits) as the value to be calculated into four bits. Therefore, it is necessary to separately prepare outside the hardware or the software a pre-processing system. These matters are also problems to be solved.

SUMMARY OF THE INVENTION

The present invention was made in order to solve the above-mentioned problems.

In the present invention, it is possible to utilize LSI having an operational calculating function for calculating the CRC creating multinomial equation:

$$G(X)=X^{16}+X^{12}+X^{5}+1$$

in order to calculate the CRC code which is described in ITU—T [International Telecommunication Union—Telecommunication Sector CCITT (Consultative Committee of International Telephone and Telegraph)] Recommendation.

It is an object of the present invention to solve the background-art defects such as the above-mentioned problems.

It is another object of the present invention to provide a CRC operational calculating method and a CRC operational calculation circuit solving the background-art defects such as the above-mentioned problems.

It is still another object of the present invention to provide a CRC operational calculating method and a CRC operational calculation circuit capable of realizing the calculation of the cyclic redundancy check by use of only a combination of logic circuits.

It is still another object of the present invention to provide a CRC operational calculating method and a CRC operational calculation circuit capable of realizing calculation of the cyclic redundancy check by use of only a combination of logic circuits such as gate circuits, and thereby enable the completion of the calculation within one clock cycle.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
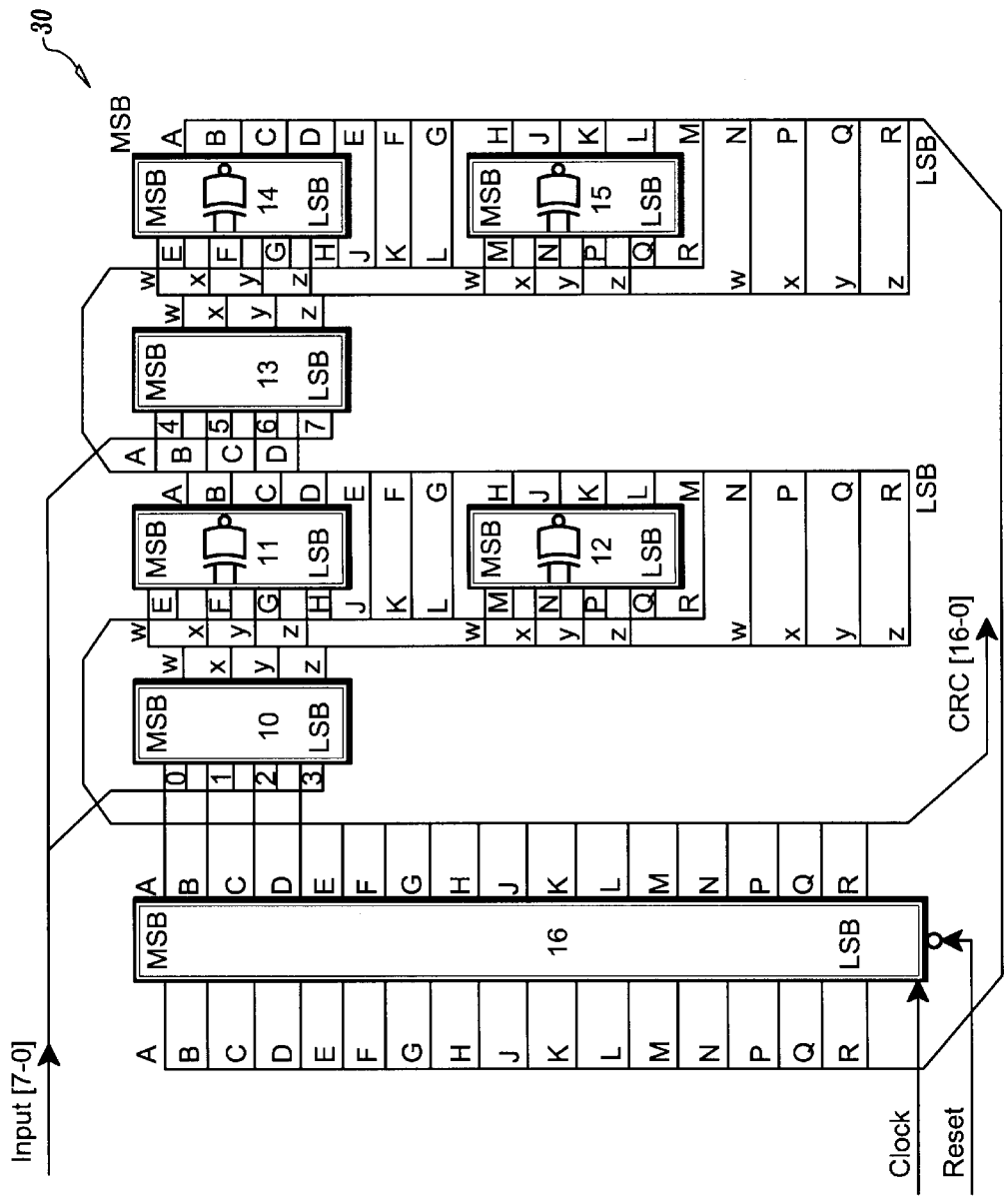
FIG. 1 is a circuit diagram for explaining an embodiment of a CRC operational calculating method and a CRC operational calculation circuit for practicing the method according to the present invention.

In describing preferred embodiments of the present invention illustrated in the drawings, specific terminology is employed for the sake of clarity. However, the present invention is not intended to be limited to the specific terminology so selected and it is to be understood that each specific element includes all technical equivalents which operate in a similar manner.

Referring now to the drawings, wherein like reference numerals designate identical or corresponding parts throughout the several views, and more particularly to FIG. 1 thereof, there are illustrated a CRC operational calculating method and a CRC operational calculation circuit for practicing the present invention.

FIRST EMBODIMENT

The first embodiment according to the present invention is described hereinafter, referring to FIG. 1.

The CRC calculation circuit 30 of the first embodiment shown in FIG. 1 can be practically installed in the communication apparatus for practicing a digital communication method such as a MODEM communication apparatus or in the LSI. The first embodiment of the present invention is featured in that the operational calculation of the CRC (Cyclic Redundancy Check) for performing the error detection process and the correction process for the Communication Data Input [7·0] based on the V-series Standard in which the standardization is being advanced by the ITU-T [International Telecommunication Union—Telecommunication Sector CCITT (Consultative Committee of International Telephone and Telegraph)] is practiced by use of hardware mainly composed of logic circuits.

As shown in FIG. 1, the CRC calculating circuit is constructed with hardware mainly composed of logic devices including a register 16, a first XOR gate 10, a first XNOR gate 11, a second XNOR gate 12, a second XOR gate 13, a third XNOR gate 14, and a fourth XNOR gate 15, etc.

The register 16 is a logic element having a function of storing the CRC code [16·0] as the calculation result of the cyclic redundancy check in synchronism with the clock signal Clock (logic signal) inputted from the outside of the CRC calculation circuit 30 and another function of returning the data to an initial value by action of the reset signal Reset.

The first XOR gate 10 performs an exclusive logical sum calculation (Exclusive OR), based on the predetermined corresponding relationship (bit order), of the respective bits of the lower-column four bits {0(MSB), 1, 2, 3 bits of the Communication Data Input [7·0]} including the lowermost-column bit LSB (Least Significant Bit) of the data to be calculated (hereinafter, called "Communication Data Input [7·0]") and the respective bits of the upper-column four bits {A(MSB), B, C, D bits of the CRC code [16·0]} including the uppermost-column bit MSB (Most Significant Bit) of the CRC code [16·0]. The first XOR gate 10 outputs the result of the exclusive logical sum calculation as the first XOR output signal.

In more detail, the first XOR gate 10 performs an exclusive logical sum calculation based on a predetermined corresponding relationship and outputs the result of the exclusive logical sum calculation (the first XOR output signal). Calculation of the exclusive logical sum of the 0 (LSB) of the Communication Data Input [7·0] and the A bit (MSB) of the CRC code [16·0] is performed, and the result of the calculation is outputted as the w bit (MSB) of the first XOR output signal. Calculation of the exclusive logical sum of the 1 bit of the Communication Data Input [7·0] and the B bit of the CRC code [16·0] is performed, and the result of the calculation is outputted as the x bit of the first XOR output signal. Calculation of the exclusive logical sum of the 2 bit of the Communication Data Input [7·0] and the C bit of the CRC code [16·0] is performed, and the result of the calculation is outputted as the y bit of the first XOR output signal. Calculation of the exclusive logical sum of the 3 bit of the Communication Data Input [7·0] and the D bit of the CRC code [16·0] is performed, and the result of the calculation is outputted as the z bit (LSB; Least Significant Bit) of the first XOR output signal.

The first XNOR gate 11 then performs an exclusive NOR logical sum calculation based on the predetermined corresponding relationship (order of the bits) of the respective bits of the aforementioned first XOR output signal and the respective fifth through eighth bits of the CRC code [16·0] stored in the register 16 and outputs the result of the exclusive NOR logical sum calculation (Exclusive NOR) as the first XNOR output signal.

The first XNOR gate 11 performs the exclusive NOR logical sum calculation based on the predetermined corresponding relationship (order of the bits) of the respective bits (w, x, y, z bits) of the first XOR output signal and the respective fifth through eighth bits (E, F, G, H bits) of the CRC code [16·0] stored in the register 16. The result of the exclusive NOR logical sum calculation is outputted as the first XNOR output signal.

The calculation of the exclusive NOR logical sum of the w bit (MSB) of the first XOR output signal and the fifth bit (E bit) of the CRC code [16·0] is performed and the result of the exclusive NOR logical sum calculation is outputted as the A bit (MSB) of the first XNOR output signal. The calculation of the exclusive NOR logical sum of the x bit of the first XOR output signal and the sixth bit (F bit) of the CRC code [16·0] is performed and the result of the exclusive NOR logical sum calculation is outputted as the B bit of the first XNOR output signal. The calculation of the exclusive NOR logical sum of the y bit of the first XOR output signal and the seventh bit (G bit) of the CRC code [16·0] is performed and the result of the exclusive NOR logical sum calculation is outputted as the C bit of the first XNOR output signal. The calculation of the exclusive NOR logical sum of the z bit of the first XOR output signal and the eighth bit (H bit) of the CRC code [16·0] is performed and the result of the exclusive NOR logical sum calculation is outputted as the D bit (LSB) of the first XNOR output signal.

The second XNOR gate 12 performs calculation of the exclusive NOR logical sum based on the predetermined corresponding relationship (order of the bits) of the respective bits of the first XOR output signal and the respective twelfth through fifteenth bits of the CRC code [16·0] stored in the register 16 and outputs the result of the exclusive negation logical sum calculation as the second XNOR output signal.

More specifically, the second XNOR gate 12 performs the exclusive NOR logical sum calculation based on the predetermined corresponding relationship of the respective bits (w, x, y, z bits) of the first XOR output signal and the respective twelfth through fifteenth bits (M, N, P, Q bits) of the CRC code [16·0] stored in the register 16 and outputs the result of the exclusive NOR logical sum calculation as the second XNOR output signal.

In the second XNOR gate 12, the calculation of the exclusive NOR logical sum of the w bit of the first XOR output signal and the twelfth bit (M bit) of the CRC code [16·0] is performed and the result of the exclusive NOR logical sum calculation is outputted as the H bit (MSB) of the second XNOR output signal. The calculation of the exclusive NOR logical sum of the x bit of the first XOR output signal and the thirteenth bit (N bit) of the CRC code [16·0] is performed and the result of the exclusive NOR logical sum calculation is outputted as the J bit of the second XNOR output signal. The calculation of the exclusive NOR logical sum of the y bit of the first XOR output signal and the fourteenth bit (P bit) of the CRC code [16·0] is performed and the result of the exclusive NOR logical sum calculation is outputted as the K bit of the second XNOR output signal. The calculation of the exclusive NOR logical sum of the z bit of the first XOR output signal and the fifteenth bit (Q bit) of the CRC code [16·0] is performed and the result of the exclusive NOR logical sum calculation is outputted as the L bit (LSB) of the second XNOR output signal.

The second XOR gate 13 performs calculation of the exclusive logical sum based on the predetermined corresponding relationship (order of the bits) of the respective lower-column four bits including the lowermost-column bit LSB of the data to be calculated Input [7·0] and respective bits of the first XNOR output signal and outputs the result of the exclusive logical sum calculation as the second XOR output signal.

More specifically, the second XOR gate 13 performs the exclusive logical sum calculation based on the predetermined corresponding relationship (order of the bits) of the respective upper-column four bits (4, 5, 6, 7 bits) including the uppermost-column bit MSB (Most Significant Bit) of the data to be calculated Input [7·0] and the respective bits (A, B, C, D bits) of the first XNOR output signal, and outputs the result of the exclusive logical sum calculation as the second XOR output signal (w, x, y, z bits).

In the second XOR gate 13, the calculation of the exclusive logical sum of the 4 bit (MSB) of the data to be calculated Input [7·0] and the A bit of the first XNOR output signal is performed and the result of the exclusive logical sum calculation is outputted as the w bit (MSB) of the second XOR output signal. Calculation of the exclusive logical sum of the 5 bit of the data to be calculated Input [7·0] and the B bit of the first XNOR output signal is performed and the result of the exclusive logical sum calculation is outputted as the x bit of the second XOR output signal. Calculation of the exclusive logical sum of the 6 bit of the data to be calculated Input [7·0] and the C bit of the first XNOR output signal is performed and the result of the exclusive logical sum calculation is outputted as the y bit of the second XOR output signal. Calculation of the exclusive logical sum of the lowermost-column bit LSB (7 bit) of the data to be calculated Input [7·0] and the D bit of the first XNOR output signal is performed and the result of the exclusive logical sum calculation is outputted as the z bit (LSB) of the second XOR output signal.

The third XNOR gate 14 performs the calculation of the exclusive NOR logical sum based on the predetermined corresponding relationship (order of the bits) of the respective bits of the second XOR output signal, the respective ninth through eleventh bits of the CRC code [16·0], and the uppermost-column bit MSB (H bit) of the second XNOR output signal, and outputs the result of the exclusive NOR logical sum calculation as the third XNOR output signal.

More specifically, the third XNOR gate 14 performs the calculation of the exclusive NOR logical sum based on the predetermined corresponding relationship (order of the bits) of the respective bits of the second XOR output signal (w, x, y, z bits), the respective ninth through eleventh bits (J, K, L bits) of the CRC signal code [16·0], and the uppermost-column bit MSB (H bit) of the second XNOR output signal, and outputs the result of the exclusive NOR logical sum calculation as the third XNOR output signal.

In the third XNOR gate 14, the calculation of the exclusive NOR logical sum of the w bit of the second XOR output signal and the ninth bit (J bit) of the CRC code [16·0] is performed and the result of the exclusive NOR logical sum calculation is outputted as the A bit (MSB) of the third XNOR output signal. Calculation of the exclusive NOR logical sum of the x bit of the second XOR output signal and the tenth bit (K bit) of the CRC code [16·0] is performed and the result of the exclusive NOR logical sum calculation is outputted as the B bit of the third XNOR output signal. Calculation of the exclusive NOR logical sum of the y bit of the second XOR output signal and the eleventh bit (L bit) of the CRC code [16·0] is performed and the result of the exclusive NOR logical sum calculation is outputted as the C bit of the third XNOR output signal. Calculation of the exclusive NOR logical sum of the z bit (LSB) of the second XOR output signal and the uppermost-column bit MSB (H bit) of the second XNOR output signal is performed and the result of the exclusive NOR logical sum calculation is outputted as the D bit (LSB) of the third XNOR output signal.

The fourth XNOR gate 15 performs calculation of the exclusive NOR logical sum based on the predetermined corresponding relationship (order of the bits) of the respective bits of the second XOR output signal, the respective upper-column three bits including the uppermost-column bit MSB of the first XOR output signal, and the sixteenth bit of the CRC code [16·0], and outputs the result of the exclusive NOR logical sum calculation as the fourth XNOR output signal.

More specifically, the fourth XNOR gate 15 performs the calculation of the exclusive NOR logical sum based on the predetermined corresponding relationship (order of the bits) of the respective bits of the second XOR output signal (w, x, y, z bits), the respective upper-column three bits (w, x, y bits) including the uppermost-column bit MSB (w bit) of the first XOR output signal, and the sixteenth bit (R bit) of the CRC code [16·0], and outputs the result of the exclusive NOR logical sum calculation as the fourth XNOR output signal (H, J, K, L bits).

In the fourth XNOR gate 15, the calculation of the exclusive NOR logical sum of the x bit of the second XOR output signal and the uppermost-column bit MSB (w bit) of the first XOR output signal is performed and the result of the exclusive NOR logical sum calculation is outputted as the J bit of the fourth XNOR output signal. Calculation of the exclusive NOR logical sum of the y bit of the second XOR output signal and the x bit of the first XOR output signal is performed, and the result of the exclusive NOR logical sum calculation is outputted as the K bit (MSB) of the fourth XNOR output signal. Calculation of the exclusive NOR logical sum of the z bit of the second XOR output signal and the y bit of the first XOR output signal is performed and the result of the exclusive NOR logical sum calculation is outputted as the L bit of the fourth XNOR output signal. Calculation of the exclusive NOR logical sum of the w bit (MSB) of the second XOR output signal and the sixteenth bit (R bit) of the CRC code [16·0] is performed, and the result of the exclusive NOR logical sum calculation is outputted as the H bit (MSB) of the fourth XNOR output signal.

The respective bits of the third XNOR output signal are inputted to the input stage of the register 16 as the upper-column four bits including the uppermost-column bit MSB of the CRC code [16·0] (A–D). And then, the lower-column three bits including the lowermost-column bit LSB of the second XNOR output signal are inputted to the input stage of the register 16 as the fifth through seventh bits of the CRC code [16·0] (E–G). Then, the respective bits of the fourth XNOR output signal are inputted to the input stage of the register 16 as the eighth through eleventh bits of the CRC code [16·0] (H–L). Then, the respective bits of the second XOR output signal are inputted to the input stage of the register 16 as the lower-column four bits including the lowermost-column bit LSB of the CRC code [16·0] (N–R).

In such manner as mentioned heretofore, the CRC code [16·0] can be created.

As is apparent from the foregoing description, in the CRC calculation circuit 30 of the first embodiment, it is possible to realize a CRC calculating circuit constructed with a combination logic circuit performing calculation of the cyclic redundancy check instead of using a shift register for performing a data transferring process of only one bit at a time for each clock "Clock" signal. Thereby, calculation of the cyclic redundancy check with one clock "Clock" cycle can be performed. As a result, it is possible to raise the speed of the cyclic redundancy check calculation. The calculation time can thus be shortened.

Furthermore, the calculation of the cyclic redundancy check can be realized by use of only the combined logic circuit, and does not require use of an apparatus in which the result of the cyclic redundancy check calculation is previously stored in a surplus table storing medium (system memory) and the required CRC calculation value obtained by referring to the table (surplus table). Thereby, usage of the finite (limited) capacity of the system memory can be avoided. As a result, effective utilization of the system resources can be maintained. In addition, a system cycle required for performing a subtracting calculation for the memory reference can be omitted, and the calculation of the cyclic redundancy check can be completed with one clock "Clock" cycle. As a result, it is possible to calculate the cyclic redundancy check with high speed.

In the CRC calculation circuit 30 according to the aforementioned circuit structure, the below-described first through fifth processes are performed.

The first process is a calculation process in which the calculation of the exclusive logical sum of the respective four bits to be firstly inputted and the upper-column four bits including the uppermost-column bit MSB of the just preceding CRC code [16·0] is performed, and the thirteenth through sixteenth bits of the newest CRC code [16·0] are created.

The second process following the first process is a calculation process of creating the twelfth bit (M) of the newest CRC code [16·0] by use of the lowermost-column bit LSB of the just preceding CRC code [16·0].

The third process following the second process is the calculation process of creating the fifth through seventh bits of the newest CRC code [16·0].

The fourth process following the third process is the calculation process of performing the calculation of the exclusive NOR logical sum of the contents entering the thirteenth through sixteenth bits of the newest CRC code [16·0] and the contents of the twelfth through fifteenth bits of the just preceding CRC code [16·0] and creating the eighth through eleventh bits of the newest CRC code [16·0].

The fifth process following the fourth process is the calculation process of performing the calculation of the exclusive NOR logical sum of the contents of the thirteenth through sixteenth bits of the newest CRC code [16·0] and the contents of the fifth through eighth bits of the just preceding CRC code [16·0] and creating the first through fifth bits of the newest CRC code [16·0].

SECOND EMBODIMENT

A second embodiment of the present invention is described hereinafter by reference to FIGS. 1 and 2. Since the explanation of the second embodiment in connection with FIG. 1 is the same as that of the first embodiment, explanation thereof is omitted here.

As to the CRC calculation circuit 30 of the second embodiment, the multinomial equation G(X) of creating the CRC shown in the ITU-T Recommendation is as follows:

$$G(X)=X^{16}+X^{12}+X^5+1.$$

Details thereof are explained below.

Figure 2:
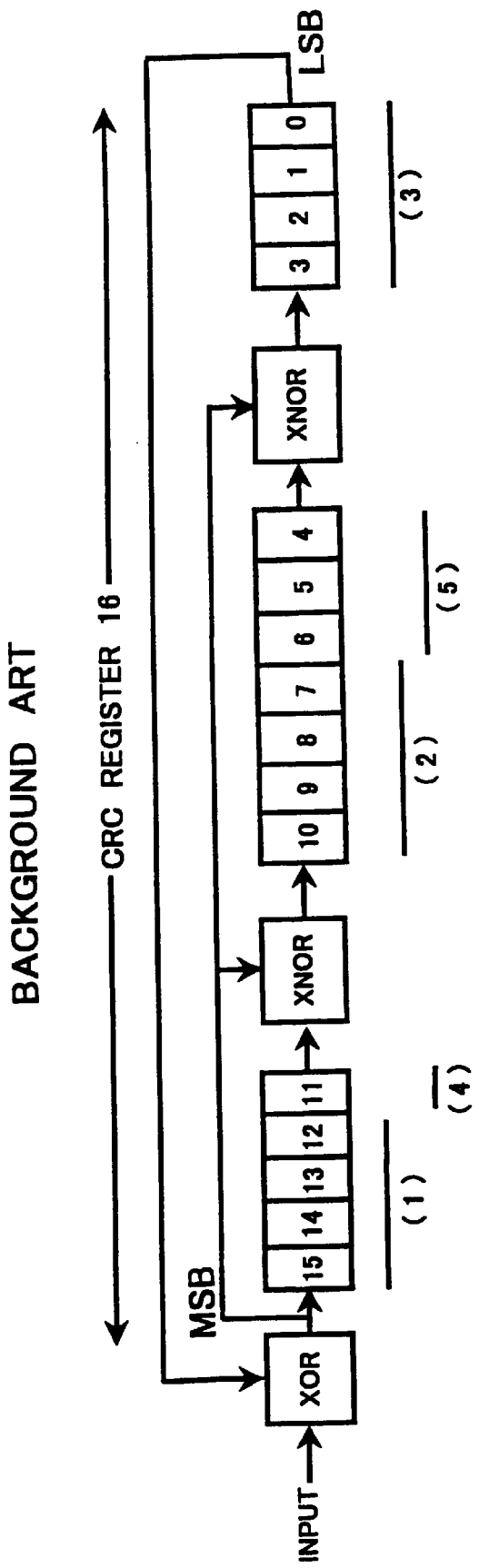
FIG. 2 is a data flow diagram for explaining the operation of calculating the CRC by use of a shift register according to the background art.
Figure 3:
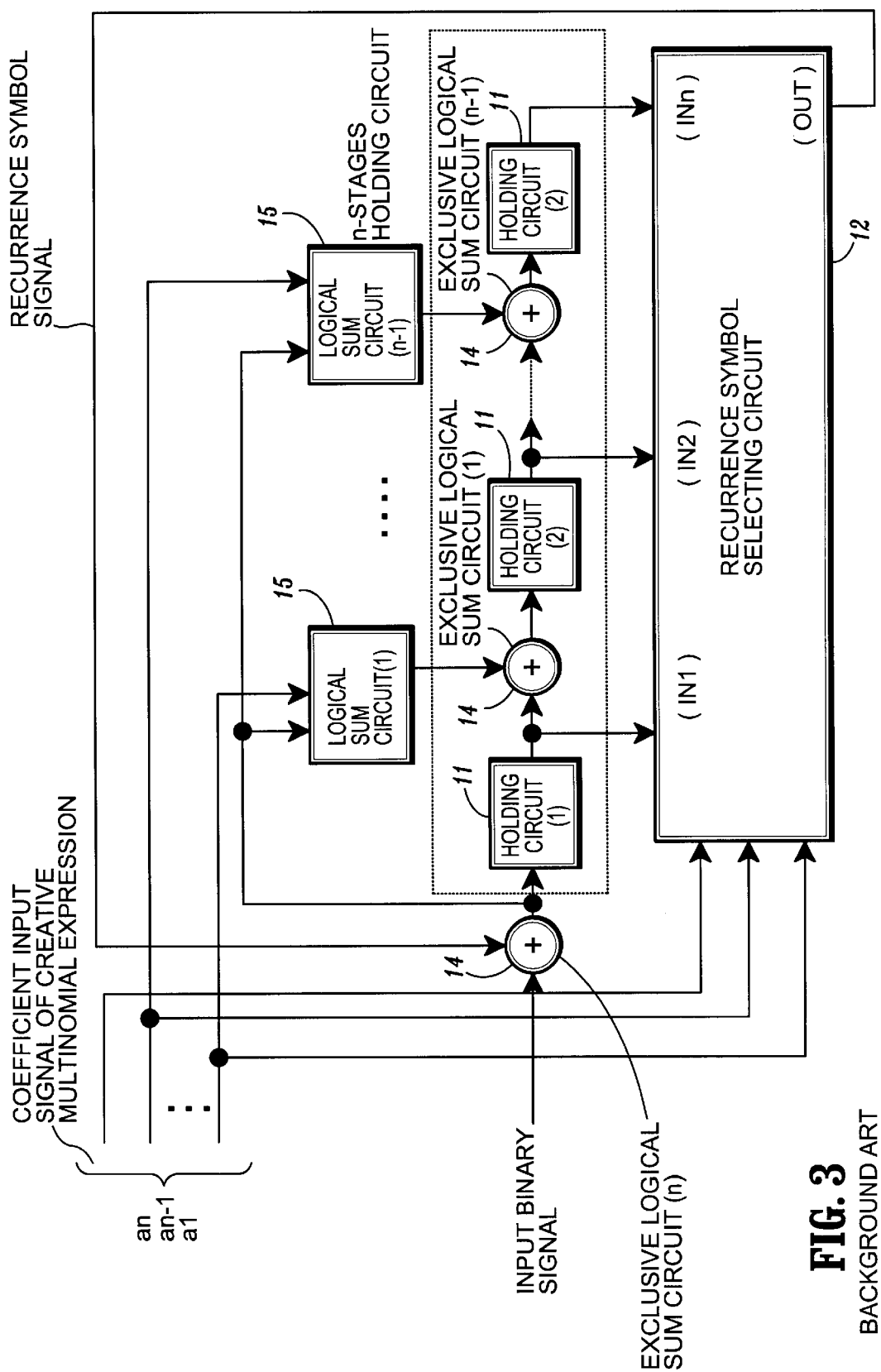
FIG. 3 is a circuit diagram for explaining the first background-art CRC calculation circuit.
Figure 4:
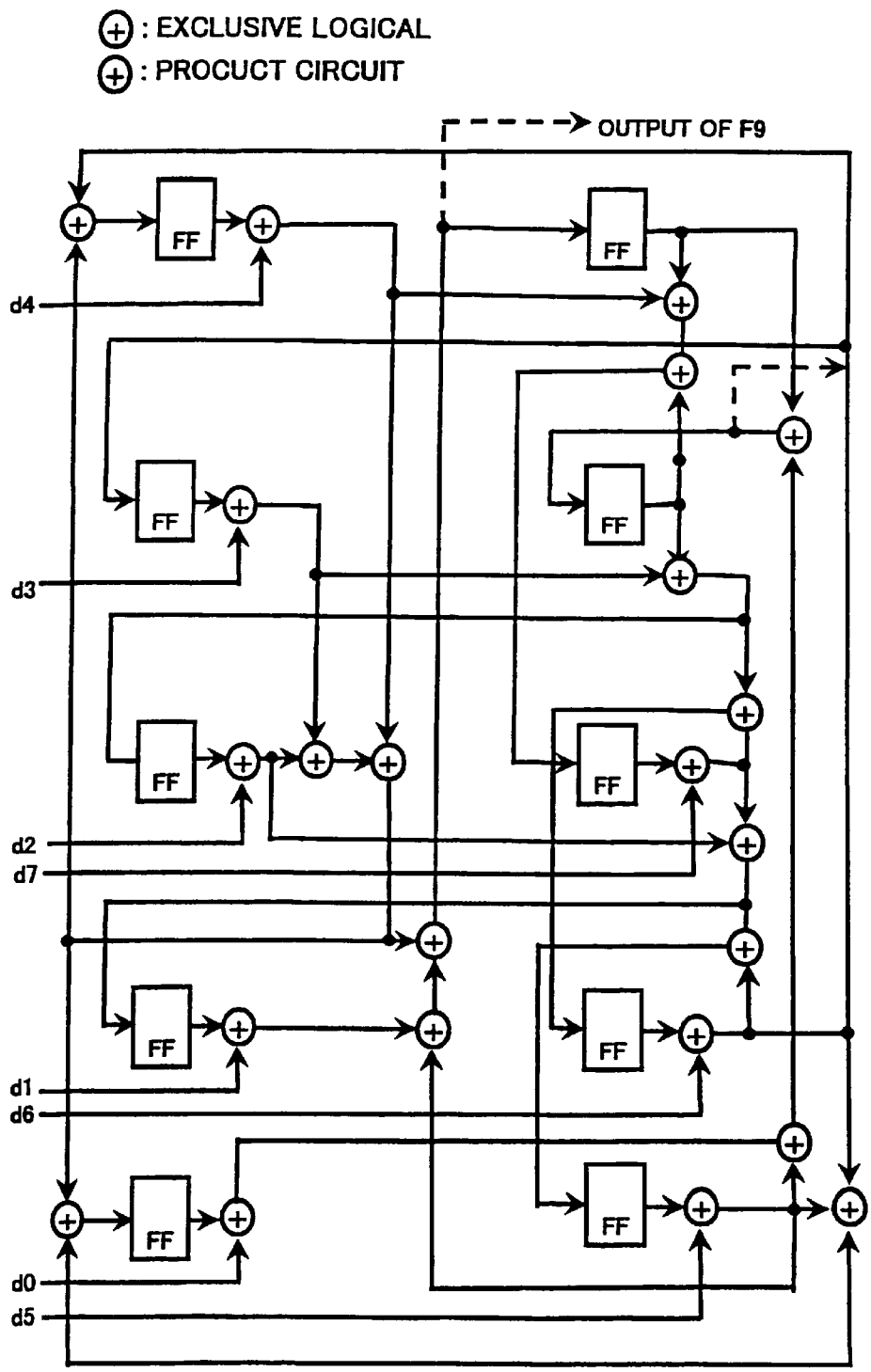
FIG. 4 is a circuit diagram for explaining the second background-art CRC calculation circuit.
Figure 5:
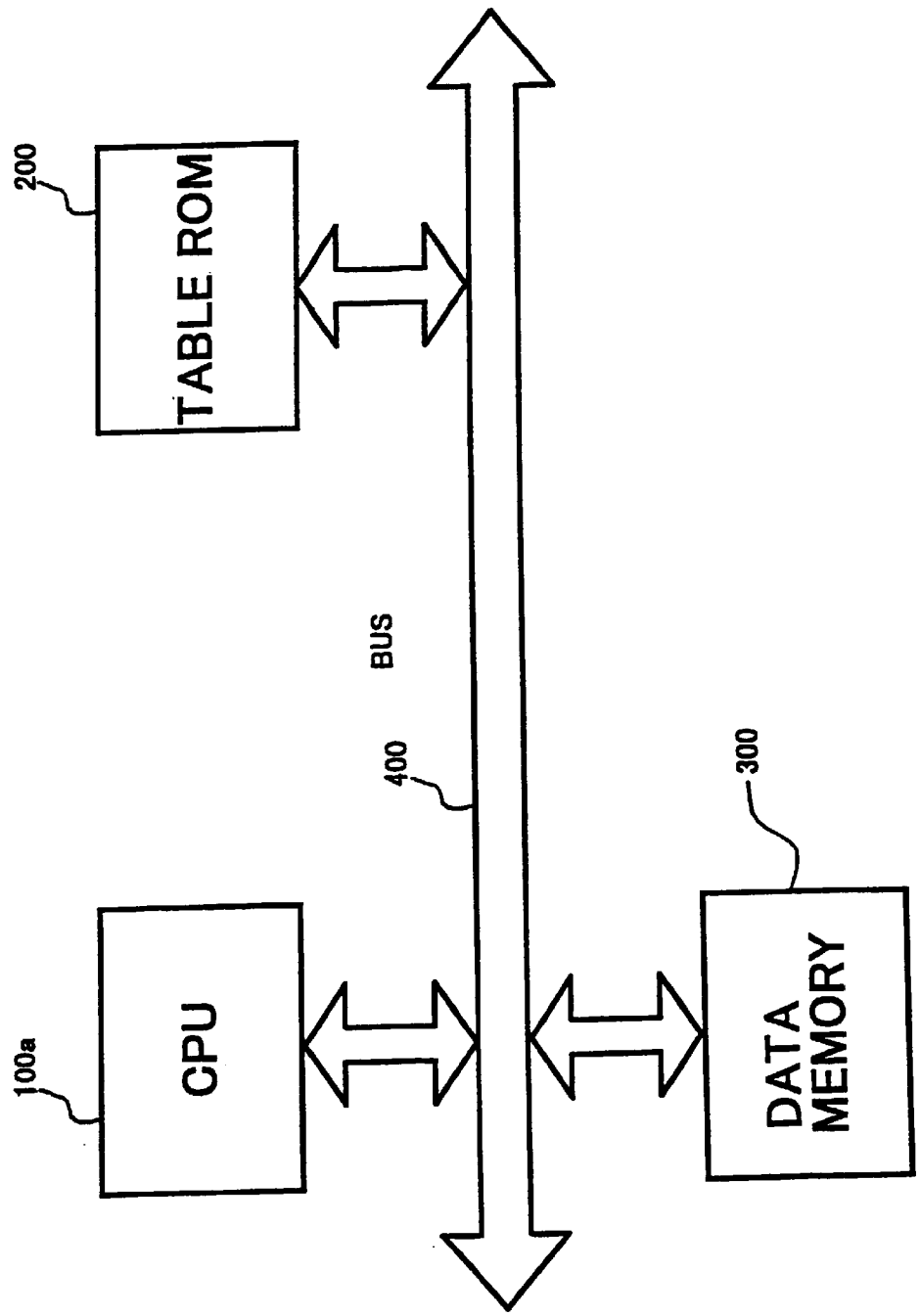
FIG. 5 is a circuit diagram for explaining the third background-art CRC calculation circuit.
Figure 6:
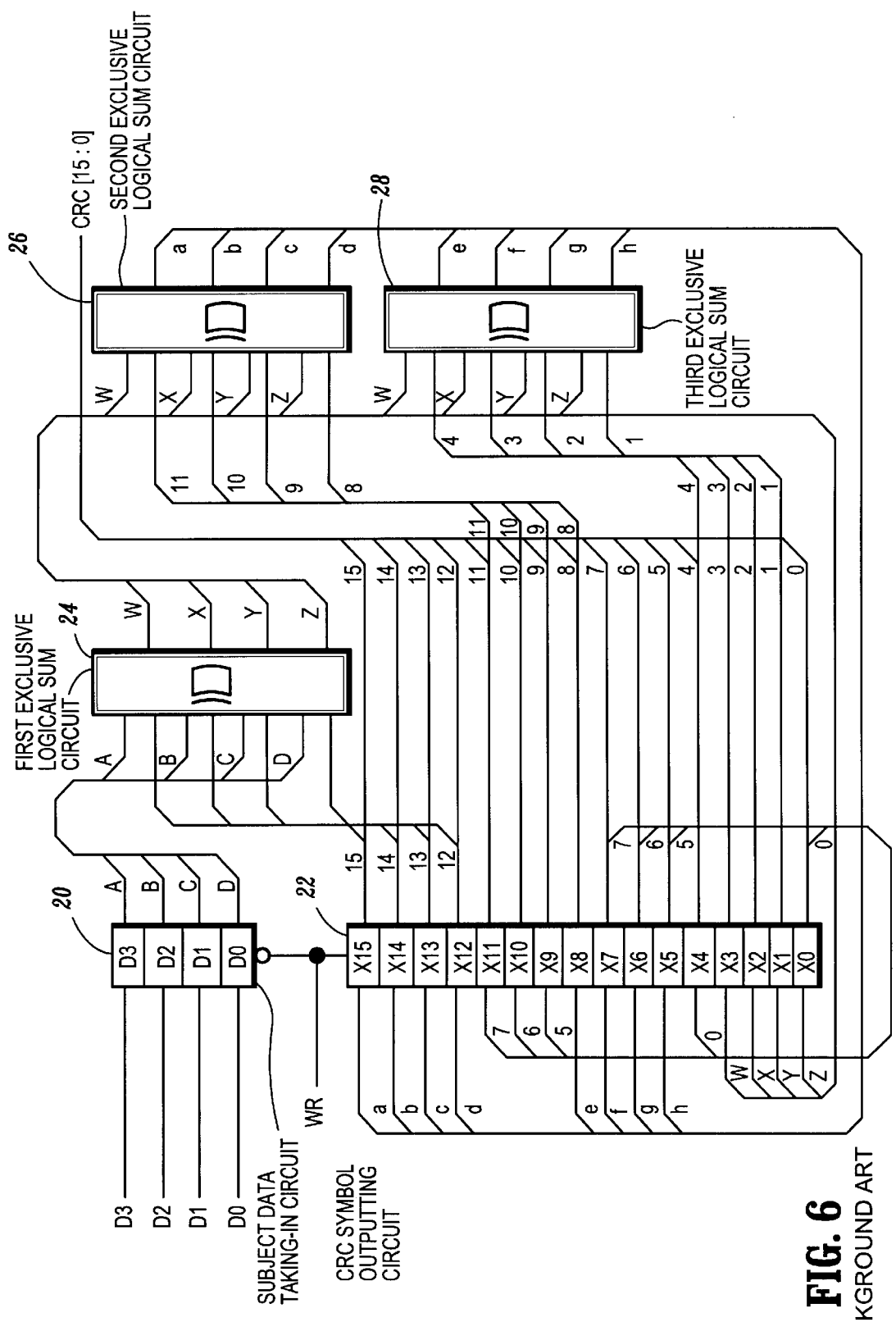
FIG. 6 is a circuit diagram for explaining the fourth background-art CRC calculation circuit.

The calculation circuit for calculating the cyclic redundancy check by use of a shift register as shown in FIG. 2 is well known. In FIG. 2, the boxes identified as 1–15 are constructed with, for instance, a logic element such as a D-type flip-flop, etc., and all of the boxes as a whole form a shift register.

In the calculation circuit for calculating the cyclic redundancy check shown in FIG. 2, input data are inputted from the left side corresponding to the aforementioned data to be calculated (Communication Data Input [7·0]) and are inputted from the position represented as "Input" in order from the lowermost-column bit LSB. Each time the input data are inputted, the clock (not shown) is operated and performs an operation of shifting the data to the right. Consequently, eight clock inputs are required for inputting one byte of data (eight bit bytes).

However, when the operation is divided per four bits, it is apparent that the contents of the bit row at the time point when the shifting operation of the respective four bits at the side of the lowermost-column bit LSB (=the respective four bits including the lowermost-column bit LSB) is completed are determined in a sense only by both of the content of the previously stored CRC code [16·0] and the content of the newly inputted four bits. The above-mentioned state is described below in more detail.

Regarding the registers (twelfth through fifteenth registers) of the underlined portion (1), those registers simply serve as a gate XOR taking the exclusive logical sum of the four bits to be firstly inputted and the four bits of the outputs of the registers (0-th through third registers) of the underlined portion (3).

Regarding the eleventh register 11 of the underlined portion (4), the content of the fifteenth register 15 is shifted as it is by the clock. In a similar way, regarding the registers (0-th through third registers) of the underlined portion (3), the contents of the registers 8 through 11 are shifted as those contents are by the clock and stored in the memory.

Regarding the registers (seventh through tenth registers) of the underlined portion (2), the result of the calculation of the exclusive NOR logical sum XNOR of the contents newly entering the registers (twelfth through fifteenth registers) of the underlined portion (1) and the previous contents of the eleventh through fourteenth registers are stored in the registers of the underlined portion (2).

Similarly, regarding the registers (0-th through third registers) of the underlined portion (3), the result of the calculation of the exclusive NOR logical sum XNOR of the contents newly entering the registers (twelfth through fifteenth registers) of the underlined portion (1) and the previous contents of the fourth through seventh registers are stored in the registers of the underlined portion (3).

Those relationships mentioned above indicate that the contents of the register at the time point of inputting the four bits can be constructed with the combined logics of the previous contents in the register and the contents of the lowermost-column bit LSB side four bits. Furthermore, the output values at the time point of inputting the lowermost-column bit LSB side four bits are used as the inputs for the remaining uppermost-column bit MSB side four bits (four bits including the uppermost-column bit MSB), and one more stage of the similar combined logic circuit is provided in the CRC calculation circuit 30 of the second embodiment. In such circuit structure, it is apparent that the combined logic circuit can be constructed in the state of including also the uppermost-column bit MSB side four bits.

The result of the calculation is converted to parallel form by use of the combined logic circuit on the basis of the above-mentioned steps and structure, and the hardware of the logic circuit structure can be realized by the aforementioned CRC calculation circuit 30. Refer to FIG. 1.

In FIG. 1, the calculation circuits for the inputs of the lowermost-column bit LSB side four bits respectively correspond to the aforementioned first XOR gate 10, first XNOR gate 11, and second XNOR gate 12. On the other hand, the calculation circuits for the inputs of the uppermost-column bit MSB side four bits respectively correspond to the aforementioned second XOR gate 13, third XNOR gate 14 and fourth XNOR gate 15.

In FIG. 1, the register 16 is a register for storing the result of the cyclic redundancy check, and the register 16 can be constructed with D-type flip-flops, etc.

In this logic circuit, the portion operating with the clock signal is limited to only one register of sixteen bits for storing the value of the CRC code (cyclic redundancy check code). The speed of the calculation is dependent upon the output delay time of the combined logic circuit constructed with the exclusive logical sum gate XOR and the exclusive NOR logical sum gate XNOR. Therefore, if the total sum of those delay times is not larger than one cycle of the system, the calculation time becomes substantially equal to one cycle thereof.

As explained heretofore, according to the second embodiment, the calculation of the CRC creating multinomial equation G(X) is realized only by the combined logic circuit instead of the shift register 16 practicing the data transferring process of only one bit per one time clock "Clock". Thereby, the calculation of the CRC creating multinomial equation (X) with one clock "Clock" cycle can be completed.

As a result, it is possible to perform the calculation of the CRC creating multinomial equation G(X) with high speed (to shorten the calculation time).

Furthermore, calculation of the CRC creating multinomial equation G(X) is realized only by the combined logic circuit instead of requiring an apparatus in which the calculation result of the CRC creating multinomial equation G(X) has been previously stored in the surplus table storing medium (system memory) and thereafter the required CRC calculation value is obtained by referring to the above table. Thereby, usage of the finite (limited) capacity of the system memory can be avoided.

As a result, it is possible to effectively utilize the system resource. In addition, the system cycle required for the subtracting calculation for the memory reference can be omitted, and the calculation of the CRC creating multinomial equation G(X) can be completed with one clock "Clock" cycle. As a result, it is possible to calculate the CRC creating multinomial equation G(X) with high speed.

As is apparent from the foregoing description of the embodiments according to the present invention, an advantageous functional effect as mentioned can be attained.

According to the embodiments of the present invention relating to the CRC calculating method and the CRC calculation circuit, since the CRC calculating part is constructed only with the combined gates (gate circuits), the CRC calculation can be performed with only one clock.

Other numerous embodiments or numerous modifications of the present invention are possible in light of the above teachings. It is therefore to be understood that, within the scope of the appended claims, the invention may be practiced otherwise than as specifically described herein.

Having now fully described the invention, it will be apparent to one of ordinary skill in the art that many changes and modifications can be made thereto without departing from the spirit and scope of the invention as set forth herein. This application is based on Japanese Patent Application No. JPAP10-167,595, filed on Jun. 15, 1998, the entire contents of which are herein incorporated by reference.

What is claimed is:

1. A CRC operational calculating method of performing a CRC code calculation in order to practice a judgment of communication data error comprising the steps of:

a first process for performing an operational calculation of exclusive logical sum XOR between each of four bits to be inputted firstly and each of the respective upper-column four bits including uppermost-column bit of a CRC code and thereby creating thirteenth through sixteenth bits of a newest CRC code;

a second process for creating a twelfth bit of the newest CRC code by use of a lowermost-column bit of an immediately-previous CRC code;

a third process for creating fifth through seventh bits of the newest CRC code by use of the ninth through eleventh bits of the immediately-previous CRC code;

a fourth process for performing on operational calculation of exclusive logical sum XOR between the contents of the thirteenth through sixteenth bits of the newest CRC code and the contents of the twelfth through fifteenth bits of the immediately-previous CRC code and thereby creating the eighth through eleventh bits of the newest CRC code; and a fifth process for performing an operational calculation of exclusive logical sum XOR between the contents of the thirteenth through sixteenth bits of the newest CRC code and the contents of the fifth through eighth bits of the immediately-previous CRC code and thereby creating the first through fourth bits of the newest CRC code.

2. A CRC operational calculation circuit for performing an operational calculation of a CRC code by use of hardware in order to practice a judgment of communication data error comprising:

a register for storing a CRC code created as a result of a operational calculation for the cyclic redundancy check in synchronism with a clock;

a first exclusive logical sum XOR gate for performing an exclusive logical sum calculation based on a predetermined corresponding relationship between each of respective lower-column four bits including a lowermost-column bit of calculation data to be operationally calculated and each of respective upper-column four bits including uppermost-column bits of said CRC code stored in said register and for outputting a result of the operational calculation of the exclusive logical sum XOR as a first XOR output signal;

a first exclusive NOR logical sum XNOR gate for performing an exclusive NOR logical sum calculation based on the predetermined corresponding relationship between each of respective bits of said first XOR output signal and fifth through eighth bits of said CRC code stored in said register, and for outputting a result of the operational calculation of the exclusive NOR logical sum XNOR as a first XNOR output signal;

a second exclusive NOR logical sum XNOR gate for performing an exclusive NOR logical sum calculation based on the predetermined corresponding relationship between each of the respective bits of said first XOR output signal and twelfth through fifteenth bits of said CRC code stored in said register, and for outputting a result of the operational calculation of the exclusive logical sum XOR as a second XNOR output signal;

a second exclusive logical sum XOR gate for performing an exclusive logical sum calculation based on a predetermined corresponding relationship between each of respective upper-column four bits including the uppermost-column bit of the data to be calculated and each of the respective bits of said first XNOR output signal, and for outputting a result of the operational calculation as a second XOR output signal;

a third exclusive NOR logical sum XNOR gate for performing an exclusive NOR logical sum calculation based on the predetermined corresponding relationship between each of the respective bits of said second XOR output signal and each of respective ninth through eleventh bits of said CRC code, and an uppermost-column bit of said second XNOR output signal, and for outputting a result of the operational calculation of the exclusive NOR logical sum XNOR as a third XNOR output signal; and a fourth exclusive NOR logical sum XNOR gate for performing an exclusive NOR logical sum calculation based on the predetermined corresponding relationship between each of the respective bits of said second XOR output signal and each of respective upper-column three bits including the uppermost-column bit of said first XOR output signal, and a sixteenth bit of said CRC code, and for outputting a result of the operational calculation of the exclusive NOR logical sum XNOR as a fourth XNOR output signal, wherein the respective bits of said third XNOR output signal are inputted to an input stage of said register as upper-column four bits including the uppermost-column bit of said CRC code, wherein the lower-column three bits including the lowermost-column bit of said second XNOR output signal are inputted to the input stage of said register as the fifth through seventh bits of said CRC code, wherein the respective bits of said fourth XNOR output signal are inputted to the input stage of said register as the eighth through eleventh bits of said CRC code, and wherein the respective bits of said second XOR output signal are inputted to the input stage of said register as lower-column four bits including a lowermost-column bit of said CRC code.

3. A CRC operational calculation method for performing an operational calculation of a CRC code by use of hardware in order to practice a judgment of communication data error, wherein, when the calculation of the CRC code is practiced on the basis of a CRC creating multinomial equation G(X), where $$G(X)=X^{16}+X^{12}+X^5+1,$$

the CRC code obtained as the calculating result of the cyclic redundancy check is stored in a memory in synchronism with an external clock, said method comprising:

performing a first exclusive logical sum calculation on a basis of a predetermined corresponding relationship between each of respective lower-column four bits including a lowermost-column bit of calculated data to be inputted to an input stage and each of respective upper-column four bits including an uppermost-column bit of said CRC code thus stored in said memory, the result of said first exclusive logical sum calculation being outputted as a first XOR output signal;

performing a first exclusive NOR logical sum calculation on a basis of the predetermined corresponding relationship between each of the respective bits of said first XOR output signal, and a result of said first exclusive NOR logical sum calculation and outputting a result as a first XNOR output signal;

performing a second exclusive NOR logical sum calculation on a basis of the predetermined corresponding relationship between each of respective bits of the first XOR output signal and each of respective twelfth through fifteenth bits of said CRC code thus stored in said memory, the result of said second exclusive NOR logical sum calculation being outputted as the second XNOR output signal;

performing a second exclusive logical sum calculation on a basis of the predetermined corresponding relationship between each of the respective upper-column four bits including the uppermost-column of the data to be calculated and each of the respective bits of said first XNOR output signal, the result of said second exclusive logical sum calculation being outputted as the second XOR output signal;

performing a third exclusive NOR logical sum calculation on a basis of the predetermined corresponding relationship between each of the respective bits of said second XOR output signal and each of respective ninth through eleventh bits of said CRC code, and a uppermost-column bit of said second XNOR output signal, a result of said third exclusive NOR logical sum calculation being outputted as a third XNOR output signal;

performing a fourth exclusive NOR logical sum calculation on a basis of the predetermined corresponding relationship between each of the respective bits of said second XOR output signal, each of the respective upper-column three bits including the uppermost-column bits of said first XOR output signal, and a sixteenth bit of said CRC code, the result of said fourth exclusive NOR logical sum calculation being outputted as a fourth XNOR output signal; and wherein each of said respective bits of said third XNOR output signal is inputted to the input stage of said register as upper-column four bits including the uppermost-column bit of said CRC code, the lower-column three bits including the lowermost-column bit of said second XNOR output signal are inputted to the input stage of said register as the fifth through seventh bits of said CRC code, each of the respective bits of said fourth XNOR output signal is inputted to the input stage of said register as eighth through eleventh bits of said CRC code, and each of the respective bits of said second XOR output signal is inputted to the input stage of said register as lower-column four bits including lowermost-column bit of said CRC code.

4. A CRC operational calculating method of performing an operational calculation of a CRC code by use of hardware in order to practice a judgment of communication of a data error comprising the steps of:

performing a cyclic redundancy check by use of a register for storing a CRC code created as a result of an operational calculation, in synchronism with an external clock;

performing a first exclusive logical sum calculation by use of a first exclusive logical sum XOR gate, based on a predetermined corresponding relationship between each of the respective lower-column four bits including the lowermost-column bit of data to be operationally calculated and each of respective upper-column four bits including the uppermost-column bits of said CRC code stored in said register and outputting a result of the operational calculation of the exclusive logical sum XOR as a first XOR output signal;

performing an exclusive NOR logical sum calculation by use of a first exclusive NOR logical sum XNOR gate, based on the predetermined corresponding relationship between each of the respective bits of said first XOR output signal and each of the respective fifth through eighth bits of said CRC code stored in said register and outputting a result of the operational calculation of the exclusive NOR logical sum XNOR as a first XNOR output signal;

performing a second exclusive NOR logical sum calculation by use of a second exclusive NOR logical sum XNOR gate, based on the predetermined corresponding relationship between each of the respective bits of said first XOR output signal and each of the respective twelfth through fifteenth bits of said CRC code stored in said register and outputting a result of the operational calculation of the exclusive logical sum XOR as a second XOR output signal;

performing a second exclusive logical sum calculation by use of a second exclusive logical sum XOR gate, based on the predetermined corresponding relationship between each of the respective upper-column four bits including the uppermost-column bit of the data to be calculated and each of the respective bits of said first XNOR output signal and outputting a result of the operational calculation of the exclusive logical sum XOR as a second XOR output signal;

performing a third exclusive NOR logical sum calculation by use of a third exclusive NOR logical sum XNOR gate, based on the predetermined corresponding relationship between each of the respective bits of said second XOR output signal, each of the respective ninth through eleventh bits of said CRC code, and the uppermost-column bit of said second XNOR output signal and outputting the result of the operational calculation of the exclusive NOR logical sum XNOR as a third XNOR output signal;

performing a fourth exclusive NOR logical sum calculation by use of a fourth exclusive NOR logical sum XNOR gate, based on the predetermined corresponding relationship between each of the respective bits of said second XOR output signal, each of the respective upper-column three bits including the uppermost-column bit of said first XOR output signal, and the sixteenth bit of said CRC code and outputting the result of the operational calculation of the exclusive NOR logical sum XNOR as a fourth XNOR output signal, wherein the respective bits of said third XNOR output signal are inputted to the input stage of said register as upper-column four bits including the uppermost-column bit of said CRC code, wherein the lower-column three bits including the lowermost-column bit of said second XNOR output signal are inputted to the input stage of said register as the fifth through seventh bits of said CRC code, wherein the respective bits of said fourth XNOR output signal are inputted to the input stage of said register as the eighth through eleventh bits of said CRC code, and wherein the respective bits of said second XOR output signal are inputted to the input stage of said register as the lower-column four bits including the lowermost-column bit of said CRC code.

5. A CRC operational calculating method of performing an operational calculation of the CRC code by use of hardware in order to practice a judgment of communication data error, wherein, when the calculation of the CRC code is practiced on the basis of the CRC creating multinomial equation G(X) as shown in the ITU-T recommendation;

$$G(X)=X^{16}+X^{12}+X^{5}+1,$$

the CRC code obtained as the calculating result of the cyclic redundancy check is stored in a memory in synchronism with the clock inputted from the external side, said method comprising:

performing a first exclusive logical sum calculation on a basis of a predetermined corresponding relationship between each of respective lower-column four bits including a lowermost-column bit of calculated data to be inputted to an input stage and each of respective upper-column four bits including an uppermost-column bit of said CRC code thus stored in said memory, the result of said exclusive logical sum calculation being outputted as a first XOR output signal;

performing a first exclusive NOR logical sum calculation on the basis of the predetermined corresponding relationship between each of the respective bits of said first XOR output signal, a result of said first exclusive NOR logical sum calculation being outputted as a first XNOR output signal;

performing a second exclusive NOR logical sum calculation on a basis of the predetermined corresponding relationship between each of the respective bits of first XOR output signal and each of the respective twelfth through fifteenth bits of said CRC code thus stored in said memory, the result of said exclusive NOR logical sum calculation being outputted as a second XNOR output signal;

performing a second exclusive logical sum calculation on a basis of the predetermined corresponding relationship between each of the respective upper-column four bits including the uppermost-column of the data to be calculated and each of the respective bits of said first XNOR output signal, a result of said second exclusive logical sum calculation being outputted as a second XOR output signal;

performing a third exclusive NOR logical sum calculation on a basis of the predetermined corresponding relationship between each of the respective bits of said second XOR output signal, each of the respective ninth through eleventh bits of said CRC code, and an uppermost-column bit of said second XNOR output signal, a result of said third exclusive NOR logical sum calculation being outputted as a third XNOR output signal; and performing a fourth exclusive NOR logical sum calculation on a basis of the predetermined corresponding relationship between each of the respective bits of said second XOR output signal, each of the respective upper-column three bits including the uppermost-column bits of said first XOR output signal, and the sixteenth bit of said CRC code, the result of said fourth exclusive NOR logical sum calculation being outputted as a fourth XNOR output signal, wherein each of said respective bits of said third XNOR output signal is inputted to the input stage of said register as the upper-column four bits including the uppermost-column bit of said CRC code, the lower-column three bits including the lowermost-column bit of said second XNOR output signal is inputted to the input stage of said register as the fifth through seventh bits of said CRC code, each of the respective bits of said fourth XNOR output signal is inputted to the input stage of said register as the eighth through eleventh bits of said CRC code, and each of the respective bits of said second XOR output signal is inputted to the input stage of said register as the lower-column four bits including the lowermost-column bit of said CRC code.

* * * * *